US008809127B2

(12) United States Patent
Ko et al.

(10) Patent No.: US 8,809,127 B2
(45) Date of Patent: Aug. 19, 2014

(54) CURABLE COMPOSITON

(71) Applicant: LG Chem, Ltd., Seoul (KR)

(72) Inventors: Min Jin Ko, Daejeon (KR); Jae Ho Jung, Daejeon (KR); Myung Sun Moon, Daejeon (KR); Bum Gyu Choi, Daejeon (KR); Dae Ho Kang, Daejeon (KR); Min Kyoun Kim, Daejeon (KR); Byung Kyu Cho, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 14/139,389

(22) Filed: Dec. 23, 2013

(65) Prior Publication Data

US 2014/0103390 A1 Apr. 17, 2014

Related U.S. Application Data

(63) Continuation of application No. PCT/KR2012/010062, filed on Nov. 26, 2012.

(30) Foreign Application Priority Data

Nov. 25, 2011 (KR) .................. 10-2011-0124649
Nov. 26, 2012 (KR) .................. 10-2012-0134557

(51) Int. Cl.
H01L 21/00 (2006.01)
B32B 33/00 (2006.01)
C08G 77/04 (2006.01)
H01L 33/00 (2010.01)
H01L 23/29 (2006.01)

(52) U.S. Cl.
USPC .......... 438/127; 428/447; 525/478; 257/100; 257/791; 257/E33.059

(58) Field of Classification Search
None
See application file for complete search history.

(56) References Cited

U.S. PATENT DOCUMENTS

| 5,530,075 | A  | * | 6/1996  | Morita et al. ............ 525/431 |
| 8,080,614 | B2 | * | 12/2011 | Morita et al. ............ 525/100 |
| 8,258,502 | B2 | * | 9/2012  | Yoshitake et al. ........ 257/40  |
| 2002/0161140 | A1 | * | 10/2002 | Yoneda et al. ............ 526/90 |
| 2004/0241927 | A1 | * | 12/2004 | Kato et al. ............... 438/202 |
| 2005/0212008 | A1 | * | 9/2005  | Miyoshi .................... 257/100 |
| 2006/0073347 | A1 | * | 4/2006  | Morita et al. ............ 428/447 |
| 2006/0081864 | A1 | * | 4/2006  | Nakazawa ................ 257/98  |
| 2007/0112147 | A1 | * | 5/2007  | Morita et al. ............ 525/478 |
| 2009/0099321 | A1 | * | 4/2009  | Yoshitake et al. ........ 525/475 |
| 2009/0118440 | A1 | * | 5/2009  | Nakanishi et al. ........ 525/478 |
| 2009/0123764 | A1 | * | 5/2009  | Morita et al. ............ 428/446 |
| 2011/0147955 | A1 | * | 6/2011  | Kashiwagi ............... 257/791 |
| 2011/0160410 | A1 | * | 6/2011  | Sagawa et al. ........... 525/478 |
| 2013/0009201 | A1 | * | 1/2013  | Ko et al. ................... 257/100 |
| 2013/0187176 | A1 | * | 7/2013  | Ko et al. ................... 257/88 |

FOREIGN PATENT DOCUMENTS

| JP | 11-274571 | | 10/1999 |
| JP | 2001-196151 | A | 7/2001 |
| JP | 2002-226551 | A | 8/2002 |
| JP | 2005314591 | A | 11/2005 |
| JP | 2010265442 | A | 11/2010 |
| KR | 1020110087243 | A | 8/2011 |
| KR | 1020110087245 | A | 8/2011 |

* cited by examiner

Primary Examiner — Robert S Loewe
(74) Attorney, Agent, or Firm — McKenna Long & Aldridge, LLP

(57) ABSTRACT

Provided is a curable composition and its use. The curable composition may exhibit excellent processability and workability. The curable composition has excellent light extraction efficiency, crack resistance, hardness, thermal and shock resistance and an adhesive property after curing. The curable composition may provide a cured product exhibiting stable durability and reliability under severe conditions for a long time and having no whitening and surface stickiness.

14 Claims, No Drawings

CURABLE COMPOSITON

This application is a Continuation Bypass Application of International Patent Application No. PCT/KR2012/010062, filed Nov. 26, 2012, and claims the benefit of Korean Patent Application No. 10-2011-0124649 filed on Nov. 25, 2011, and Korean Patent Application No. 10-2012-0134557 filed on Nov. 26, 2012, in the Korean Intellectual Property Office, the disclosures of which are incorporated herein by reference.

TECHNICAL FIELD

The present application relates to a curable composition and its use.

BACKGROUND

A light emitting diode (LED), particularly a blue or ultraviolet (UV) LED having an emission wavelength of approximately 250 to 550 nm, is a high-brightness product using a GaN-based compound semiconductor such as GaN, GaAlN, InGaN or InAlGaN. In addition, it is possible to form a high-quality full-color image by a method of combining red and green LEDs with a blue LED. For example, a technique of manufacturing a white LED by combining a blue or UV LED with a fluorescent material has been known. Such LEDs are being widely used as backlights for liquid crystal displays (LCDs) or general lighting.

As an LED encapsulant, an epoxy resin having a high adhesive property and excellent mechanical durability is being widely used. However, the epoxy resin has a lower light transmittance of a blue light or UV ray region, and low light resistance. Accordingly, for example, patent documents 1 to 3 disclose techniques for solving the above-described problems. However, encapsulants disclosed in the above references do not have sufficient thermal resistance and light resistance.

As a material having excellent light and thermal resistances with respect to a low wavelength region, a silicon resin has been known. However, the silicon resin has stickiness on a cured surface. In addition, to effectively apply the silicon resin as an encapsulant for an LED, characteristics such as high refractivity, crack resistance, surface hardness, adhesive strength and thermal and shock resistance need to be ensured.

PRIOR ART DOCUMENTS

Patent Documents

PATENT DOCUMENT 1: Japanese Patent Publication No.: H11-274571
PATENT DOCUMENT 2: Japanese Patent Publication No.: 2001-196151
PATENT DOCUMENT 3: Japanese Patent Publication No.: 2002-226551

DETAILED DESCRIPTION

Technical Object

The present application provides a curable composition and its use.

Technical Solution

One illustrative curable composition may includes (A) an organopolysiloxane having an aliphatic unsaturated bond (referred to as "organopolysiloxane (A)") and (B) an organopolysiloxane including an alkenyl group and an epoxy group, but not including an aryl group (referred to as "organopolysiloxane (B)").

The organopolysiloxane (A) may be represented by Formula 1:

$$R^1_3SiO(R^1_2SiO)_aSiR^1_3 \qquad \text{[Formula 1]}$$

In Formula 1, $R^1$ is a monovalent hydrocarbon group, at least one of $R^1$ is an alkenyl group, at least one of $R^1$ is an aryl group, and a is a number of 3 to 1000.

In Formula 1, a may be, for example, a number of 10 to 500 or 10 to 300.

The expression "organopolysiloxane is represented as a certain average composition formula" used herein means that the organopolysiloxane is a single component represented as the certain average composition formula, or a mixture or reaction product of at least two components, and the average of compositions of respective components in the mixture or reaction product is represented as the certain average composition formula.

The term "monovalent hydrocarbon group" used herein may refer to a monovalent residue derived from an organic compound composed of carbon and hydrogen or a derivative thereof. The monovalent hydrocarbon group includes one or at least two carbons, and may be, for example, a monovalent hydrocarbon group having 1 to 25 or 2 to 25 carbon atoms. The monovalent hydrocarbon group may be, for example, an alkyl group, an alkenyl group or an aryl group.

The term "alkyl group" used herein may refer to, unless specifically defined otherwise, an alkyl group having 1 to 20, 1 to 16, 1 to 12, 1 to 8 or 1 to 4 carbon atoms. The alkyl group may have a linear, branched or cyclic structure, and may be optionally substituted with at least one substituent.

The term "alkenyl group" used herein may refer to, unless specifically defined otherwise, an alkenyl group having 2 to 20, 2 to 16, 2 to 12, 2 to 8 or 2 to 4 carbon atoms. The alkenyl group may have a linear, branched or cyclic structure, and may be optionally substituted with at least one substituent.

The term "aryl group" used herein may refer to, unless specifically defined otherwise, a monovalent residue having a benzene ring or derived from a compound including a structure in which at least two benzene rings are connected or condensed or a derivative thereof. That is, in the range of the aryl group, an aralkyl group or arylalkyl group, in addition to an aryl group conventionally referred to as an aryl group, may be used. The aryl group may be an aryl group having 6 to 25, 6 to 21, 6 to 18 or 6 to 13 carbon atoms. The aryl group may be a phenyl group, a dichlorophenyl group, a chlorophenyl group, a phenylethyl group, a phenylpropyl group, a benzyl group, a tolyl group, a xylyl group or a naphthyl group, and preferably, in one example, is a phenyl group.

In the specification, as a substituent capable of being optically substituted to a monovalent hydrocarbon group such as an alkyl group, an alkenyl group or an aryl group, a halogen, an epoxy group, an acryloyl group, a methacryloyl group, an isocyanate group, a thiol group or the above-described monovalent hydrocarbon group may be used, but the present application is not limited thereto.

In Formula 1, at least one of $R^1$ may be an alkenyl group. In one example, the alkenyl group may be present in such an amount that a molar ratio (Ak/Si) of the alkenyl groups (Ak) with respect to a total of silicon atoms (Si) included in the organopolysiloxane (A) is 0.02 to 0.2 or 0.02 to 0.15. As the molar ratio (Ak/Si) is controlled to 0.02 or more, reactivity with another component may be suitably maintained, and a phenomenon of leaking a non-reacted component from a surface of a cured product may be prevented. In addition, as the molar ratio (Ak/Si) is controlled to 0.2 or less, a crack resistance of the cured product may be excellently maintained.

The organopolysiloxane of Formula 1 may include at least one aryl group binding to a silicon atom. In the illustrative organopolysiloxane, a molar ratio (Ar/Si) of the aryl group (Ar) binding to the silicon atom with respect to a total of silicon atoms (Si) in the organopolysiloxane may be 0.3, 0.5 or 0.7 or more. In this range, the organopolysiloxane may maintain excellent characteristics such as a refractive index, light extraction efficiency, crack resistance, hardness and viscosity. Meanwhile, the upper limit of the molar ratio (Ar/Si) may be, for example, 1.5 or 1.3.

In one example, the organopolysiloxane of Formula 1 may have a viscosity at 25° C. of 2,000, 3,000, 4,000, 5,000, 7,000, 9,000 or 9,500 cP or more. In this range, processibility and hardness of the organopolysiloxane may be suitably maintained. The upper limit of the viscosity is not particularly limited, and for example, the viscosity may be 100,000, 90,000, 80,000, 70,000 or 65,000 cP or less.

The organopolysiloxane of Formula 1 may have a weight average molecular weight (Mw) of 1,500, 2,000, 3,000, 4,000 or 5,000 or more. The term "weight average molecular weight" used herein refers to a conversion value with respect to a standard polystyrene measured by gel permeation chromatography (GPC). In addition, unless specifically defined otherwise in the specification, the term "molecular weight" may refer to a weight average molecular weight. In this range, moldability, hardness and strength of the organopolysiloxane may be suitably maintained. Meanwhile, the upper limit of the molecular weight is not particularly limited, and may be 14,000, 12,000 or 10,000 or less.

The organopolysiloxane may be a reaction product, for example, a ring-opening polymerization product, of a mixture including a cyclic siloxane compound.

Here, the cyclic siloxane compound may be exemplified as a compound represented by Formula 2:

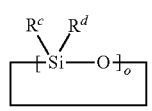

[Formula 2]

In Formula 2, $R^c$ and $R^d$ are each independently a monovalent hydrocarbon group and o is 3 to 6. In Formula 2, specific kinds of $R^c$ and $R^d$ and the range of o may be determined by an organopolysiloxane having a desired structure.

The mixture may be a cyclic siloxane compound, which may include a compound of Formula 3 and/or a compound of Formula 4.

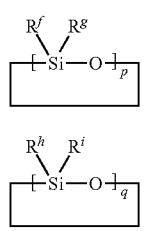

[Formula 3]

[Formula 4]

In Formulas 3 and 4, $R^f$ and $R^g$ are each independently an alkyl group having 1 to 20 carbon atoms, $R^h$ and $R^i$ are each independently an aryl group having 6 to 25 carbon atoms, p is a number of 3 to 6, and q is a number of 3 to 6. In Formulas 3 and/or 4, specific kinds of $R^f$ and $R^g$ and the ranges of p and q may be determined by an organopolysiloxane having a desired structure.

When the cyclic siloxane compound is used, an organopolysiloxane having a desired structure may be synthesized at a sufficient molecular weight. When the above mixture is reacted, functional groups such as an alkoxy group or hydroxyl group binding to a silicon atom in the synthesized organopolysiloxane may be minimized, thereby preparing a desired product having excellent physical properties.

In one example, the mixture may further include a compound represented by Formula 5.

$$(R_3SO_2)O$$  [Formula 5]

In Formula 5, R is a monovalent hydrocarbon. In Formula 5, a specific kind of R and a mixing ratio in the mixture may be determined by a structure of a desired organopolysiloxane.

In one example, the reaction of respective components in the mixture may be performed in the presence of a suitable catalyst. Therefore, the mixture may further include a catalyst. As a catalyst capable of being included in the mixture, for example, a base catalyst may be used. A suitable base catalyst may be, but is not limited to, a metal hydroxide such as KOH, NaOH or CsOH; a metal silanolate including an alkali metal compound and a siloxane, or a quaternary ammonium compound such as tetramethylammonium hydroxide, tetraethylammonium hydroxide or tetrapropylammonium hydroxide.

A ratio of the catalyst in the mixture may be suitably selected in consideration of desired reactivity, and for example, may be 0.01 to 30 parts by weight or 0.03 to 5 parts by weight relative to 100 parts by weight of a total weight of the reaction products in the mixture. In the specification, unless specifically defined otherwise, a unit "parts by weight" refers to a weight ratio between components.

In one example, the reaction may be performed in the presence of a suitable solvent. As a solvent, the reaction product in the mixture, that is, a disiloxane or organopolysiloxane, may be suitably mixed with a catalyst, and any kind of solvent may be used without obstruction to reactivity. The solvent may be, but is not limited to, an aliphatic hydrocarbon-based solvent such as n-pentane, i-pentane, n-hexane, i-hexane, 2,2,4-trimethyl pentane, cyclohexane or methylcyclohexane; an aromatic solvent such as benzene, toluene, xylene, trimethyl benzene, ethyl benzene or methylethyl benzene, a ketone-based solvent such as methylethylketone, methylisobutylketone, diethylketone, methyl n-propyl ketone, methyl n-butyl ketone, cyclohexanone, methylcyclohexanone or acetylacetone; an ether-based solvent such as tetrahydrofuran, 2-methyl tetrahydrofuran, ethyl ether, n-propyl ether, isopropyl ether, diglyme, dioxine, dimethyldioxine, ethyleneglycol monomethyl ether, ethyleneglycol dimethyl ether, ethyleneglycol diethyl ether, propyleneglycol monomethyl ether or propyleneglycol dimethyl ether; an ester-based solvent such as diethyl carbonate, methyl acetate, ethyl acetate, ethyl lactate, ethyleneglycol monomethylether acetate, propyleneglycol monomethylether acetate or ethyleneglycol diacetate; or an amide-based solvent such as N-methylpyrrolidone, formamide, N-methyl formamide, N-ethyl formamide, N,N-dimethyl acetamide or N,N-diethylacetamide.

The reaction may be performed by adding the catalyst to the reaction product. Here, a reaction temperature may be controlled within a range of, for example, 0 to 150° C. or 30 to 130° C. In addition, a reaction time may be controlled within a range of, for example, 1 hour to 3 days.

The reaction product prepared through the reaction described above may include a low molecular weight component, for example, a low molecular weight component including a compound of Formula 6 along with the linear organopolysiloxane.

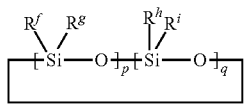
[Formula 6]

In Formula 6, $R^f$ and $R^g$ are each independently an alkyl group having 1 to 20 carbon atoms, $R^h$ and $R^i$ are each independently an aryl group having 6 to 25 carbon atoms, p is a number of 0 to 10 or 3 to 10, and q is a number of 0 to 10 or 3 to 10.

The compound of Formula 6 is a kind of low molecular weight component included in the reaction product. The term "low molecular weight component" used herein may refer to a component included in the reaction product, that is, a component having a molecular weight of 800 or less.

The reaction product including a linear organopolysiloxane may include a low molecular weight component, for example, a low molecular weight component including the compound of Formula 6 at 10, 8 or 6 wt % or less. The reaction product having desired physical properties may be prepared through the above operations. For example, a ratio of the low molecular weight component may be controlled through a conventional purifying method known in the related art.

The organopolysiloxane (B) included in the curable composition includes at least one alkenyl group and at least one epoxy group. In addition, the organopolysiloxane (B) does not include an aryl group. The curable composition including the organopolysiloxane (B) or a cured product thereof may have an enhanced adhesive property. Particularly, since the organopolysiloxane (B) does not include an aryl group, for example, a compatibility with another organopolysiloxane component such as the organopolysiloxane (A) or an organopolysiloxane (C) to be described below may be degraded, the organopolysiloxane (B) may be easily diffused onto a surface from the cured product, and thus may exhibit excellent effects with a small amount.

The term "epoxy group" used herein may refer to, unless specifically defined otherwise, a monovalent residue derived from a cyclic ether having three ring-forming atoms or a compound including the cyclic ether. The epoxy group may be a glycidyl group, an epoxyalkyl group, a glycidoxyalkyl group or an alicyclic epoxy group. An alkyl group in the epoxy group may be a linear, branched or cyclic alkyl group having 1 to 20, 1 to 16, 1 to 12, 1 to 8 or 1 to 4 carbon atoms. In addition, the alicyclic epoxy group may refer to a monovalent residue having an aliphatic hydrocarbon ring structure, and may be derived from a compound including a structure in which two carbon atoms forming the aliphatic hydrocarbon ring also form an epoxy group. The alicyclic epoxy group may be an alicyclic epoxy group having 6 to 12 carbon atoms, for example, a 3,4-epoxycyclohexylethyl group.

As the organopolysiloxane (B), an organopolysiloxane having an average composition formula of Formula 7 may be used.

$$(R_3SiO_{1/2})_l(R_2SiO_{2/2})_m(RSiO_{3/2})_r(SiO_{4/2})_s \quad \text{[Formula 7]}$$

In Formula 7, R is each independently a monovalent hydrocarbon group excluding an aryl group, or an epoxy group, at least one of R is an alkenyl group, at least one of R is an epoxy group, l, m, r and s are each 0 or a positive number, r and s are not simultaneously 0, and $(r+s)/(l+m+r+s)$ is 0.2 to 0.7.

In Formula 7, at least one or two of R may be alkenyl groups. In one example, the alkenyl group may be present in such an amount that a molar ratio (Ak/Si) of the alkenyl groups (Ak) with respect to a total of silicon atoms (Si) included in the compound (B) is 0.05 to 0.35 or 0.05 to 0.3. In the above molar ratio (Ak/Si), a cured product exhibiting an excellent reactivity with respect to another component of the curable composition, and having excellent adhesive strength after curing and thermal and shock resistance may be provided.

In Formula 7, at least one of R is also an epoxy group. Accordingly, due to the epoxy group, the organopolysiloxane (B) may suitably maintain strength and scratch resistance of the cured product, and exhibit an excellent adhesive property to a base. In one example, the epoxy group may be present in such an amount that a molar ratio (Ep/Si) of the epoxy group (Ep) with respect to a total of silicon atoms (Si) included in the organopolysiloxane (B) is 0.05, 0.15, 0.2, 0.3 or 0.5 or more. In the molar ratio (Ep/Si), a crosslinked structure of the cured product may be suitably maintained, and characteristics such as thermal resistance and an adhesive property may be excellently maintained. The upper limit of the molar ratio (Ep/Si) may be, but is not particularly limited to, for example, 0.7.

In the average composition formula of Formula 7, l, m, r and s are molar ratios of respective siloxane units, and when the sum thereof is converted into 1, l is 0.01 to 0.3, m is 0 to 0.7, r is 0 to 0.7, and s is 0 to 0.7. Here, r and s are not simultaneously 0, and for example, at least s may not be 0. To maximize strength, crack resistance and thermal and shock resistance of the cured product, and to provide a cured product having an excellent adhesive strength to a base, here, $(r+s)/(l+m+r+s)$ may be 0.2 to 0.7 or 0.3 to 0.7. The organopolysiloxane (B) may have a viscosity at 25° C. of 100, 300, 500, 1,000, 2,000, 3,000, 4,000, 5,000, 6,000, 7,000, 8,000, 9,000 or 100,000 cP or more, and therefore processibility before curing and hardness after curing may be suitably maintained.

The organopolysiloxane (B) may have, for example, a molecular weight of 1,000 or more. As the molecular weight is controlled to 1,000 or more, a cured product having excellent processibility and workability before curing, and excellent crack resistance, thermal and shock resistance and adhesive property to a base after curing may be provided. The upper limit of the molecular weight may be, but is not particularly limited to, for example, 5,000. Here, a molecular weight of the compound (B) may be a weight average molecular weight, or a molecular weight of a conventional compound.

A method of preparing the organopolysiloxane (B) is not particularly limited, and may be, for example, a method of preparing an organopolysiloxane conventionally known or a method similar to that of preparing the organopolysiloxane (A).

The organopolysiloxane (B) may be included at, for example, 0.5 to 10 or 0.5 to 5 parts by weight relative to 100 parts by weight of the a total of the organopolysiloxanes of the cured copolymer (excluding the organopolysiloxane (B)). In such a range, a composition having an excellent adhesive property, transparency, water resistance, crack resistance and thermal and shock resistance or a cured product thereof may be provided.

The curable composition may further include (C) an organopolysiloxane having a crosslinked structure.

The term "crosslinked structure" used herein may refer to an organopolysiloxane including at least one of a T unit and a tetrafunctional siloxane unit (hereinafter, referred to as a "Q unit") possibly and conventionally represented as ($SiO_2$), that is, an organopolysiloxane not corresponding to that having a partially-crosslinked structure.

In one example, the organopolysiloxane (C) may be represented as an average composition formula of Formula 8.

$$(R_3SiO_{1/2})_d(R_2SiO_{2/2})_e(RSiO_{3/2})_f(SiO_{4/2})_g \quad \text{[Formula 8]}$$

In Formula 8, R is each independently a monovalent hydrocarbon group or an epoxy group. However, at least one of R is an alkenyl group, at least one of R is an aryl group, and when d+e+f+g is converted into 1, d is 0.05 to 0.5, e is 0 to 0.3, f is 0.6 to 0.95, and g is 0 to 0.2. Here, (d+e)/(d+e+f+g) is 0.2 to 0.7, e/(e+f+g) is 0.3 or less, and f/(f+g) is 0.8 or more.

In Formula 8, one or at least two of R may be alkenyl groups. In one example, the alkenyl group may be present in such an amount that a molar ratio (Ak/Si) of the alkenyl group (Ak) with respect to a total of silicon atoms (Si) included in the organopolysiloxane (C) is 0.05 to 0.4 or 0.05 to 0.35. As the molar ratio (Ak/Si) is controlled to 0.05 or more, reactivity with another component may be suitably maintained, and a phenomenon of leaking a non-reacted component from a surface of a cured product may be prevented. In addition, as the molar ratio (Ak/Si) is controlled to 0.4 or 0.35 or less, the hardness, crack resistance and thermal and shock resistance of the cured product may be excellently maintained.

In Formula 8, at least one of R may be an aryl group. Accordingly, the refractive index and hardness of the cured product may be effectively controlled. The aryl group may be present at such an amount that a molar ratio (Ar/Si) of the aryl group (Ar) with respect to a total of silicon atoms (Si) included in the organopolysiloxane (C) is 0.5 to 1.5 or 0.5 to 1.2. As the molar ratio (Ar/Si) is controlled to 0.5 or more, the refractive index and hardness of the cured product may be maximized, and as the molar ratio (Ar/Si) is controlled to 1.5 or 1.2 or less, the viscosity and thermal and shock resistance of the composition may be suitably maintained.

In the average composition formula of Formula 8, d, e, f and g refer to molar ratios of respective siloxane units, and when the sum thereof is converted into 1, d is 0.05 to 0.5, e is 0 to 0.3, f is 0.6 to 0.95, and g is 0 to 0.2. However, f and g are not simultaneously 0. To maximize the strength, crack resistance and thermal and shock resistance of the cured product, here, (d+e)/(d+e+f+g) may be controlled to 0.2 to 0.7, e/(e+f+g) may be controlled to 0.3 or less, and f/(f+g) may be controlled to 0.8 or more. Here, the lower limit of e/(e+f+g) may be, but is not particularly limited to, for example, more than 0. In addition, here, the upper limit of f/(f+g) may be, but is not particularly limited to, for example, 1.0.

The organopolysiloxane (C) may have a viscosity at 25° C. of 5,000 or 10,000 cP or more, and therefore processibility before curing and hardness after curing may be suitably maintained.

The organopolysiloxane (C) may have a molecular weight of, for example, 800 to 20,000 or 800 to 10,000. As the molecular weight is controlled to 800 or more, moldability before curing or strength after curing may be effectively maintained, and as the molecular weight may be controlled to 20,000 or 10,000 or less, viscosity may be maintained at a suitable level.

A method of preparing the organopolysiloxane (C) is not particularly limited, but may employ a preparing method conventionally known in the related art, or a similar method to that for preparing the organopolysiloxane (A).

For example, the organopolysiloxane (C) may be mixed at 50 to 1,000 or 50 to 700 parts by weight relative to 100 parts by weight of the organopolysiloxane (A). As the weight ratio of the organopolysiloxane (C) is controlled to 50 parts by weight or more, strength of a cured product may be excellently maintained, and the weight ratio of the organopolysiloxane (C) is controlled to 1,000 or 700 parts by weight or less, a crack resistance and thermal and shock resistance may be excellently maintained.

The curable composition may include (D) an organopolysiloxane having one or at least two hydrogen atoms binding to a silicon atom (referred to as "compound (D)").

The compound (D) may serve as a crosslinking agent crosslinking curable compositions. As the compound (D), various kinds of compounds including a hydrogen atom binding to a silicon atom (Si—H) may be used. The compound (D) may be a linear, branched, cyclic or crosslinkable organopolysiloxane, and may be a compound having 2 to 1,000 or 3 to 300 silicon atoms.

In one example, the compound (D) may be a compound of Formula 9 or a compound represented as average composition formula of Formula 10.

$$R_3SiO(R_2SiO)_nSiR_3 \quad \text{[Formula 9]}$$

In Formula 9, R is each independently hydrogen or a monovalent hydrocarbon group, one or at least two of R are hydrogen atoms, at least one of R is an aryl group, and n is 1 to 100.

$$(R_3SiO_{1/2})_h(R_2SiO_{2/2})_i(RSiO_{3/2})_j(SiO_2)_k \quad \text{[Formula 10]}$$

In Formula 10, R is each independently hydrogen or a monovalent hydrocarbon group, one or at least two of R are hydrogen atoms, at least one of R is an aryl group, and when h+i+j+k is converted into 1, h is 0.1 to 0.8, i is 0 to 0.5, j is 0.1 to 0.8, and k is 0 to 0.2.

The compound of Formula 9 may be a linear organopolysiloxane having at least two hydrogen atoms binding to a silicon atom, and in Formula 9, n may be 1 to 100, 1 to 50, 1 to 25, 1 to 10 or 1 to 5.

In one example, a molar ratio (H/Si) of hydrogen atoms (H) binding to silicon atoms with respect to a total of silicon atoms (Si) included in the compound (D) may be 0.2 to 0.8 or 0.3 to 0.75. As the molar ratio is controlled to 0.2 or 0.3 or more, curability of the composition may be excellently maintained, and as the molar ratio is controlled to 0.8 or 0.75 or less, crack resistance and thermal and shock resistance may be excellently maintained.

In addition, the compound (D) may include at least one aryl group, and therefore, at least one of R in Formula 9 or at least one of R in Formula 10 may be an aryl group. Accordingly, a refractive index and hardness of the cured product may be effectively controlled. The aryl group may be present at such an amount that a molar ratio (Ar/Si) of the aryl groups (Ar) with respect to a total of silicon atoms (Si) included in the compound (D) is 0.5 to 1.5 or 0.5 to 1.3. As the molar ratio (Ar/Si) is controlled to 0.5 or more, a refractive index and hardness of the cured product may be maximized, and as the molar ratio (Ar/Si) is controlled to 1.5 or 1.3 or less, a viscosity and crack resistance of the composition may be suitably maintained.

The compound (D) may have a viscosity at 25° C. of 0.1 to 100,000, 0.1 to 10,000, 0.1 to 1,000 or 0.1 to 300 cP. As the compound (D) has the above viscosity, processibility of the composition and hardness of the cured product may be excellently maintained.

The compound (D) may have a molecular weight of, for example, less than 2,000, 1,000 or 800. When the molecular weight of the compound (D) is 1,000 or more, strength of the cured product may be degraded. The lower limit of the molecular weight of the compound (D) is not particularly limited, and may be, for example, 250. In the compound (D), the molecular weight may refer to a weight average molecular weight, or a conventional molecular weight of the compound.

As a method of preparing the compound (D), for example, a preparing method conventionally known in the related art may be employed, or a similar method to that for preparing the organopolysiloxane (A) may be used, but the present application is not limited thereto. In one example, a content of the compound (D) may be determined according to an amount of an alkenyl group having a different component included in the curable composition such as the organopolysiloxane (A). In one example, the compound (D) may be selected in such a range that a molar ratio (H/Ak) of hydrogen atoms (H) binding to silicon atoms included in the compound (D) with respect to a total of alkenyl groups (Ak) included in the curable composition is 0.5 to 2.0 or 0.7 to 1.5. Here, the alkenyl group included in the curable composition may be, for example, an alkenyl group included in the components (A), (B) and/or (C). In the molar ratio (H/Ak), the composition exhibiting excellent processibility and workability before curing, excellent crack resistance, hardness, thermal and shock resistance and an adhesive property after curing, and having no whitening or surface stickiness under severe conditions may be provided. A content of the compound (D) may be, for example, 50 to 500 or 50 to 400 parts by weight relative to 100 parts by weight of the compound (A).

In one example, components included in the curable composition may all include an aryl group binding to a silicon atom. In this case, a molar ratio (Ar/Si) of a total of aryl groups (Ar) included in the curable composition with respect to a total of silicon atoms (Si) included in the curable composition may be 0.5 or more. A total of silicon atoms or aryl groups included in the curable composition may be silicon atoms or aryl groups included in the component(s) (A), (B), (C) and/or (D). As the molar ratio (Ar/Si) is controlled to 0.5 or more, light transmittance, refractive index, viscosity, crack resistance and hardness of the cured product may be maximized. Here, the upper limit of the molar ratio (Ar/Si) of the aryl group is not particularly limited, and may be, for example, 2.0 or 1.5.

The curable composition may include particles, for example, inorganic particles. The inorganic particles may have a refractive index in a range in which an absolute value of a difference in refractive index between the composition and the cured product is 0.15 or less.

The particles may prevent a problem of precipitating a fluorescent material in a curing operation when the fluorescent material is mixed into the composition, or improve overall reliability by enhancing thermal resistance, protection against heat and crack resistance. In addition, the particles may serve as described above due to the above range of the refractive index, and maintain transparency of the composition or cured product, thereby enhancing brightness when applied to a device.

As the particles, various kinds of particles used in the related art having the absolute value of the difference in refractive index between the composition excluding the particles and the cured product thereof of 0.15 or less may be used. The particles may have the absolute value of the difference in refractive index between the composition excluding the particles and the cured product thereof of 0.1 or 0.07 or less. For example, the particles may be silica ($SiO_2$), organosilica, alumina, alumino silica, titania, zirconia, cesium oxide, hafnium oxide, niobium pentoxide, tantalum pentoxide, indium oxide, tin oxide, indium tin oxide, zinc oxide, silicon, zinc sulfide, calcium carbonate, barium sulfate, aluminosilicate or magnesium oxide, and may be porous or hollow particles.

The particles may have an average diameter of, for example, 1 nm to 50 μm or 2 nm to 10 μm. When the average diameter is 1 nm or more, the particles may be uniformly dispersed in the composition or cured product thereof, and when the average diameter is 50 μm or less, the dispersion of the particles may be effectively performed, and precipitation of the particles may be prevented.

The particles may be included at 0.1 to 30 or 0.2 to 10 parts by weight relative to 100 parts by weight of the compound (A). When a content of the particles is 0.1 parts by weight or more, excellent inhibition of the precipitation of a fluorescent material or enhancement of reliability of the device may be ensured, and when a content of the particles is 30 parts by weight or less, processibility may be excellently maintained.

The composition may further include a hydrosilylation catalyst. As a hydrosilylation catalyst, all conventional components known in the related art may be used. As such a catalyst, a platinum-, palladium- or rhodium-based catalyst may be used. In the specification, a platinum-based catalyst may be used in consideration of catalyst efficiency, and may be, but is not limited to, chloroplatinic acid, platinum tetrachloride, an olefin complex of platinum, an alkenyl siloxane complex of platinum or a carbonyl complex of platinum.

A content of the hydrosilylation catalyst is not particularly limited as long as the hydrosilylation catalyst is included at a catalytic amount, that is, an amount capable of serving as a catalyst. Conventionally, the hydrosilylation catalyst may be used at 0.1 to 500 ppm or 0.2 to 100 ppm based on an atomic weight of platinum, palladium or rhodium.

The composition may further include a tackifier in an aspect of additional enhancement of an adhesive property to various kinds of bases. A tackifier is a component capable of improving a self adhesive property to the composition or cured product, which may particularly improve a self adhesive property to a metal and an organic resin.

The tackifier may be, but is not limited to, a silane having at least one or two functional groups selected from the group consisting of an alkenyl group such as a vinyl group, a (meth) acryloyloxy group, a hydrosilyl group (SiH group), an epoxy group, an alkoxy group, an alkoxysilyl group, a carbonyl group and a phenyl group; or an organic organopolysiloxane such as a cyclic or linear siloxane having 2 to 30 or 4 to 20 silicon atoms. One or at least two of the tackifiers may be additionally mixed.

The tackifier may be included in the composition at a content of 0.1 to 20 parts by weight relative to 100 parts by weight of a total content of the components (A), (C) and (B). The content may be suitably changed in consideration of desired improvement in adhesive property.

The composition may further include one or at least two of additives including a reaction inhibitor such as 2-methyl-3-butyne-2-ol, 2-phenyl-3-1-butyne-2-ol, 3-methyl-3-pentene-1-in, 3,5-dimethyl-3-hexene-1-in, 1,3,5,7-tetramethyl-1,3,5, 7-tetrahexenylcyclotetrasiloxane or ethynylcyclohexane; an inorganic filler such as silica, alumina, zirconia or titania; a carbon-functional silane having an epoxy group and/or alkoxysilyl group, a partial hydrolysis-condensation product thereof or an organopolysiloxane; a thixotropic agent such as a haze-phase silica capable of being used in combination with polyether; a conductivity providing agent such as metal powder of silver, copper or aluminum or various carbon materials; or a color adjusting agent such as a pigment or dye, when necessary.

In one example, the curable composition may further include a fluorescent material. In this case, a kind of a fluorescent material which can be used is not particularly limited, and for example, a conventional kind of a fluorescent material applied to an LED package may be used to realize white light.

Another aspect of the present application provides a semiconductor device. The illustrative semiconductor device may be encapsulated by an encapsulant including a cured product of the curable composition.

Examples of a semiconductor device encapsulated by an encapsulant include a diode, a transistor, a thyristor, a photocoupler, a CCD, a solid-phase image pick-up diode, a monolithic IC, a hybrid IC, an LSI, a VLSI or an LED.

In one example, the semiconductor device may be a light emitting diode.

The light emitting diode may be one formed by stacking a semiconductor material on a substrate. The semiconductor material may be, but is not limited to, GaAs, GaP, GaAlAs, GaAsP, AlGaInP, GaN, InN, AlN, InGaAlN or SiC. In addition, as the substrate, sapphire, spinel, SiC, Si, ZnO or GaN monocrystal may be used.

In addition, to prepare the light emitting diode, when necessary, a buffer layer may be formed between a substrate and a semiconductor material. As a buffer layer, GaN or AlN may be used. A method of stacking a semiconductor material on a substrate may be, but is not particularly limited to, MOCVD, HDVPE or liquid growth. In addition, a structure of the light emitting diode may be, for example, a monojunction including an MIS junction, a PN junction, and a PIN junction, a heterojunction, or a double heterojunction. In addition, the light emitting diode may be formed using a mono or multiple quantum well structure.

In one example, an emission wavelength of the light emitting diode may be, for example, 250 to 550 nm, 300 to 500 nm or 330 to 470 nm. The emission wavelength may refer to a main emission peak wavelength. As the emission wavelength of the light emitting diode is set in the above range, a white light emitting diode having a longer life span, high energy efficiency and high color expression may be obtained.

The light emitting diode may be encapsulated using the composition. In addition, the encapsulation of the light emitting diode may be performed only using the composition, and in some cases, another encapsulant may be used in combination with the composition. When two kinds of encapsulants are used in combination, after the encapsulation using the composition, the encapsulated light emitting diode may also be encapsulated with another encapsulant, or the light emitting diode may be encapsulated with another encapsulant and then encapsulated again with the composition. As another encapsulant, an epoxy resin, a silicon resin, an acryl resin, a urea resin, an imide resin or glass may be used.

To encapsulate the light emitting diode with the composition, for example, a method including previously injecting the composition into a mold-type mold, dipping a lead frame to which the light emitting diode is fixed therein and curing the composition, or a method including injecting the composition into a mold into which the light emitting diode is inserted and curing the composition. As a method of injecting the composition, injection by a dispenser, transfer molding or injection molding may be used. In addition, as other encapsulating methods, a method of dropping the composition on the light emitting diode, coating the composition by screen printing or using a mask, and curing the composition, and a method of injecting the composition into a cup in which the light emitting diode is disposed on its bottom by a dispenser and curing the composition may be included.

In addition, the composition may be used as a diamond material fixing the light emitting diode to a lead terminal or package, or a passivation layer or package substrate on the light emitting diode when necessary.

When it is necessary to cure the composition, the curing is not particularly limited, and may be performed, for example, by maintaining the composition at a temperature of 60 to 200° C. for 10 minutes to 5 hours, or in phases with at least two steps at a suitable temperature and for a suitable time.

A shape of the encapsulant is not particularly limited, and for example, may be a bullet-type lens, plane, or thin film shape.

In addition, additional enhancement of performance of the light emitting diode may be promoted according to the conventional method known in the related art. To enhance the performance, for example, a method of disposing a reflective layer or light collecting layer on a back surface of the light emitting diode, a method of forming a complementary coloring part on its bottom, a method of disposing a layer absorbing light having a shorter wavelength than the main emission peak on the light emitting diode, a method of encapsulating the light emitting diode and further molding the light emitting diode with a lightweight material, a method of inserting the light emitting diode into a through hole to be fixed, or a method of contacting the light emitting diode with a read member by flip-chip contact to extract light from a direction of the substrate may be used.

The light emitting diode may be effectively applied to, for example, backlights for liquid crystal displays (LCDs), lights, various kinds of sensors, light sources of a printer and a copy machine, light sources for a mobile gauge, signal lights, pilot lights, display devices, light sources of planar-type light emitting diodes, displays, decorations or various kinds of lightings.

EFFECT

An illustrative curable composition exhibits excellent processibility and workability. In addition, the curable composition exhibits excellent light extraction efficiency, crack resistance, hardness, thermal and shock resistance and an adhesive property after curing. In addition, the composition may provide an encapsulant exhibiting stable durability and reliability under severe conditions for a long time and having no whitening and surface stickiness.

EMBODIMENTS

Hereinafter, the curable composition will be described in further detail with reference to Examples and Comparative Examples, but the scope of the curable composition is not limited to the following Examples.

Hereinafter, the abbreviation "Vi" refers to a vinyl group, the abbreviation "Ph" refers to a phenyl group, the abbreviation "Me" refers to a methyl group, and the abbreviation "Ep" refers to a 3-glycidoxypropyl group.

1. Measurement of Light Transmittance

A curable composition was injected between two layers of glass substrates spaced 1 mm apart from each other, and the composition was cured while maintained at 150° C. for 2 hours. Subsequently, the glass substrates were removed, and light transmittance was measured at a wavelength of 450 mm using a UV-VIS spectrometer.

<Evaluation Criteria>

○: the light transmittance of 98% or more x: the light transmittance of 98% or less 2. Evaluation of Characteristics of Device Characteristics of a device were evaluated using a 6020 LED package prepared with polyphthalamide (PPA). Particularly, the curable composition was dispensed in a PPA cup, maintained at 70° C. for 30 minutes, cured at 150° C. for 1 hour, and thereby a surface-mounted LED was manufactured. Afterward, a thermal and shock test and a long-term reliability test were performed according to the following methods.

(1) Thermal and Shock Test

The manufactured LED was maintained at −40° C. for 30 minutes, and then maintained at 100° C. for 30 minutes, which was set as one cycle, and then the cycle was repeated 10 times. The LED was maintained at room temperature, and then thermal and shock resistance thereof was evaluated by examining a peeling state. In the evaluation, 10 LEDs manufactured with the same curable composition were each subjected to the above-described test, and the number of peeled LEDs is shown in Table 1 (the number of peeled LEDs/the number of total LEDs (10)).

(2) Long-Term Reliability Test

The manufactured LED was operated for 200 hours while 30 mA of current was supplied under conditions of 85° C. and a relative humidity of 85%. Subsequently, a reduction ratio of late brightness after the operation to early brightness before the operation was measured, and evaluated according to the following criteria.

<Evaluation Criteria>

○: reduction ratio of brightness to early brightness of 10% or less x: reduction ratio of brightness to early brightness of more than 10%

Example 1

A curable composition was prepared by mixing compounds prepared by a known method and represented as Formulas A to D, thereby being cured by hydrosilylation (Mixing Amount: Compound of Formula A: 50 g, Compound of Formula B: 100 g, Compound of Formula C: 30 g, Compound of Formula D: 4 g). Subsequently, a catalyst (platinum (0)-1,3-divinyl-1,1,3,3-tetramethyldisiloxane) was added to the composition to have a content of Pt(0) of 5 ppm and uniformly mixed, and bubbles were removed with a defoamer.

$(ViMe_2SiO_{1/2})_2(MePhSiO_{2/2})_{40}$ [Formula A]

$(ViMe_2SiO_{1/2})_2(PhSiO_{3/2})_7$ [Formula B]

$(HMe_2SiO_{1/2})_2(HMeSiO_{2/2})_{0.5}(Ph_2SiO_{2/2})_{1.5}$ [Formula C]

$(ViMe_2SiO_{1/2})(Me_2SiO_{2/2})_{5.5}(EPSiO_{3/2})_{2.8}$ [Formula D]

Example 2

A curable composition capable of being cured by hydrosilylation was prepared by mixing compounds represented by Formulas A and E to H by the known method (mixing amounts: the compound of Formula A: 50 g, the compound of Formula E: 100 g, the compound of Formula F: 30 g, the compound of Formula G: 5 g and the compound of Formula H: 4 g). Subsequently, a catalyst (platinum(0)-1,3-divinyl-1, 1,3,3-tetramethyldisiloxane) was mixed into the composition to have a content of Pt(0) of 5 ppm, the mixture was uniformly mixed, and bubbles were removed using a defoamer, thereby completing the curable composition.

$(ViMe_2SiO_{1/2})(MePhSiO_{2/2})_{40}$ [Formula A]

$(ViMe_2SiO_{1/2})(MePhSiO_{2/2})(PhSiO_{3/2})_8$ [Formula E]

$(HMe_2SiO_{1/2})_2(Ph_2SiO_{2/2})_{1.5}$ [Formula F]

$(HMe_2SiO_{1/2})_3(PhSiO_{3/2})_3$ [Formula G]

$(ViMe_2SiO_{1/2})(EpMeSiO_{2/2})_5(MeSiO_{3/2})_4$ [Formula D-2]

Comparative Example 1

A curable composition was prepared by the same method as described in Example 1, except that the compound of Formula D was not used.

Comparative Example 2

A curable composition was prepared by the same method as described in Example 1, except that the compound of Formula D was not used, and 4 g of a compound of Formula I was used instead of the compound of Formula D.

$(ViMe_2SiO_{1/2})_3(EpSiO_{3/2})_{1.5}(Me_2SiO_{2/2})_8$ [Formula I]

Comparative Example 3

A curable composition was prepared by the same method as described in Example 1, except that the compound of Formula D was not used, and 4 g of a compound of Formula J was used instead of the compound of Formula D.

$(ViMe_2SiO_{1/2})_2(EpSiO_{3/2})_4(MePhSiO_{2/2})_{40}$ [Formula J]

Comparative Example 4

A curable composition was prepared by the same method as described in Example 1, except that a content of the compound of Formula D was changed to 30 g.

Comparative Example 5

A curable composition was prepared by the same method as described in Example 1, except that the compound of Formula A was not used.

Physical properties measured with respect to respective curable compositions are shown in Table 1.

TABLE 1

| | Light Transmittance | Thermal and Shock Resistance | Reliability |
|---|---|---|---|
| Example 1 | ○ | 0/10 | ○ |
| Example 2 | ○ | 0/10 | ○ |
| Comparative Example 1 | ○ | 10/10 | X |
| Comparative Example 2 | ○ | 8/10 | X |
| Comparative Example 3 | ○ | 9/10 | X |
| Comparative Example 4 | X | 10/10 | X |
| Comparative Example 5 | ○ | 10/10 | X |

What is claimed is:

1. A curable composition, comprising:

(A) an organopolysiloxane comprising an aliphatic unsaturated bond; and (B) an organopolysiloxane that is represented by an average composition formula of Formula 7, that comprises an alkenyl group and an epoxy group, and does not comprise an aryl group, and that is comprised in an amount of 0.5 to 10 parts by weight relative to 100 parts by weight of the total organopolysiloxanes in the composition:

$$(R_3SiO_{1/2})_l(R_2SiO_{2/2})_m(RSiO_{3/2})_r(SiO_{4/2})_s \qquad \text{[Formula 7]}$$

wherein R's are each independently a monovalent hydrocarbon group that is not an aryl group, or an epoxy group, with the proviso that at least one of R's is an alkenyl group and at least one of R's is an epoxy group; l, m, r and s are each 0 or a positive number, with the proviso that r and s are not simultaneously 0 and $(r+s)/(1+m+r+s)$ is 0.2 to 0.7.

2. The curable composition according to claim 1, wherein the organopolysiloxane (A) is a compound of Formula 1:

$$R^1{}_3SiO(R^1{}_2SiO)_a SiR^1{}_3 \qquad \text{[Formula 1]}$$

where $R^1$ is a monovalent hydrocarbon group, with the proviso that at least one of $R^1$'s is an alkenyl group and at least one of $R^1$'s is an aryl group; and a is a number of 3 to 1000.

3. The curable composition according to claim 1, wherein a molar ratio (Ak/Si) of alkenyl groups in the organopolysiloxane (A) with respect to silicon atoms in the organopolysiloxane (A) is 0.02 to 0.2.

4. The curable composition according to claim 1, wherein a molar ratio (Ar/Si) of aryl groups in the organopolysiloxane (A) with respect to silicon atoms in the organopolysiloxane (A) is 0.3 or more.

5. The curable composition according to claim 1, wherein a molar ratio (Ak/Si) of alkenyl groups in the organopolysiloxane (B) with respect to silicon atoms in the organopolysiloxane (B) is 0.05 to 0.35.

6. The curable composition according to claim 1, wherein a molar ratio (Ep/Si) of epoxy groups (Ep) in the organopolysiloxane (B) with respect to silicon atoms in the organopolysiloxane (B) is 0.05 or more.

7. The curable composition according to claim 1, wherein the organopolysiloxane (B) is comprised in an amount of 0.5 to 5 parts by weight relative to 100 parts by weight of a total of the organopolysiloxanes in the composition.

8. The curable composition according to claim 1, further comprising: an organopolysiloxane having an average composition formula of Formula 8:

$$(R^{14}{}_3SiO_{1/2})_d(R^{14}{}_2SiO_{2/2})_e(R^{14}SiO_{3/2})_f(SiO_{4/2})_g \qquad \text{[Formula 8]}$$

wherein $R^{14}$'s are each independently a monovalent hydrocarbon group or an epoxy group, with the proviso that at least one of $R^{14}$'s is an alkenyl group and at least one of $R^{14}$'s is an aryl group; and, when d+e+f+g is converted into 1, d is 0.05 to 0.5, e is 0 to 0.3, f is 0.6 to 0.95, and g is 0 to 0.2, with the proviso that f and g are not simultaneously 0, $(d+e)/(d+e+f+g)$ is 0.2 to 0.7, $e/(e+f+g)$ is 0.3 or less, and $f/(f+g)$ is 0.8 or more.

9. The curable composition according to claim 1, further comprising: a compound of Formula 9 or a compound having an average composition formula of Formula 10:

$$R^{15}{}_3SiO(R^{15}{}_2SiO)_n SiR^{15}{}_3 \qquad \text{[Formula 9]}$$

where $R^{15}$'s are each independently hydrogen or a monovalent hydrocarbon group, with the proviso that one or at least two of $R^{15}$ are hydrogen atoms and at least one of $R^{15}$ is an aryl group; and n is 1 to 100, and $$(R^{16}{}_3SiO_{1/2})_h(R^{16}SiO_{2/2})_i(R^{16}SiO_{3/2})_j(SiO_2)_k \qquad \text{[Formula 10]}$$

where $R^{16}$'s are each independently hydrogen or a monovalent hydrocarbon group, with the proviso that one or at least two of $R^{16}$ are hydrogen atoms and at least one of $R^{16}$ is an aryl group; and when h+i+j+k is converted into 1, h is 0.1 to 0.8, i is 0 to 0.5, j is 0.1 to 0.8, and k is 0 to 0.2, with the proviso that i and k are not simultaneously 0.

10. The curable composition according to claim 1, further comprising a catalyst.

11. A semiconductor device encapsulated with a cured product of the curable composition of claim 1.

12. A light emitting diode encapsulated with a cured product of the curable composition of claim 1.

13. A liquid crystal display comprising the light emitting diode of claim 12.

14. A lighting apparatus comprising the light emitting diode of claim 12.

* * * * *